United States Patent [19]
Saito et al.

[11] 4,151,608
[45] Apr. 24, 1979

[54] CIRCUIT ARRANGEMENT FOR SUPPRESSING MAGNETIC INDUCTION NOISE DUE TO AN ALTERNATING MAGNETIC FIELD

[75] Inventors: Nobuo Saito, Mitaka; Takashi Toyooka, Tokyo; Hirofumi Ohta, Mobara; Atsushi Asano, Tokyo, all of Japan

[73] Assignee: Hitachi, Ltd., Japan

[21] Appl. No.: 655,140

[22] Filed: Feb. 3, 1976

[30] Foreign Application Priority Data

Feb. 5, 1975 [JP] Japan .................................. 50-14413

[51] Int. Cl.$^2$ ............................................... G11C 7/02
[52] U.S. Cl. ........................................ 365/214; 365/2; 365/170; 329/200
[58] Field of Search ................ 340/174 DC, 174 TF, 340/174 PW; 365/9, 170, 206, 209, 214; 329/200

[56] References Cited

U.S. PATENT DOCUMENTS

| 3,484,766 | 12/1969 | Constantinides et al. .... 340/174 DC |
| 3,739,361 | 6/1973 | Ishikawa ...................... 340/174 PW |

OTHER PUBLICATIONS

American Institute of Physics—"Reliability of Organization of a 10$^8$ Bit Bubble Domain Memory", No. 5, 1971.

*Primary Examiner*—James W. Moffitt
*Attorney, Agent, or Firm*—Craig & Antonelli

[57] ABSTRACT

A third conductor is added to a pair of first and second parallel conductors transmitting signals, a part of which conductors are located in an alternating magnetic field. The three conductors are so arranged that the first and third conductors are symmetrical with respect to the center line of the second conductor, and the first and third conductors are interconnected at both extremities thereof.

9 Claims, 13 Drawing Figures

CIRCUIT ARRANGEMENT FOR SUPPRESSING MAGNETIC INDUCTION NOISE DUE TO AN ALTERNATING MAGNETIC FIELD

BACKGROUND OF THE INVENTION

1. Field of the Invention

This invention relates to a circuit arrangement for suppressing magnetic induction noise in a pair of parallel conductors due to an alternating magnetic field, when a signal source and a signal receiver are connected by parallel conductors in an alternating magnetic field.

2. Description of the Prior Art

A signal source is connected normally through a pair of conductors to a signal receiver. When a part of the pair of conductors is located in an alternating magnetic field, an alternating voltage, which is proportional to the product of the intensity of the alternating magnetic field and the area projected by the conductors in a plane perpendicular to lines of magnetic force, appears at the input terminal of the signal receiver. Sine this alternating voltage constitutes part of the noise, if the amplitude of the alternating magnetic field is great and the output voltage of the signal source is small, it adversely affects the signal-to-noise ratio, when signals are detected at the signal receiver end of the conductors.

In order to suppress this sort of noise, the conductors normally form a twisted pair, so that alternating voltages induced is successive small loops formed in a projection plane, which is perpendicular to lines of magnetic force, by the intertwisted conductors, compensate each other. In this method, noise due to an alternating magnetic field can be reduced considerably. However, this method cannot be applied by printed circuits. Another method for reducing this sort of noise consists in shielding the conductors with a sheath made of a high permeability substance. In this method, the sheath should be thick enough to appreciably reduce the noise. This method is also disadvantageous in that it is hardly applicable to printed circuits.

In a magnetic bubble memory device, a magnetic bubble element is located in a rotating magnetic field produced by two coils, the magnetic fields of which are perpendicular to each other and parallel to the magnetic bubble element. The electric connection of the magnetic bubble element to an external circuit is secured by several pairs of conductors of a printed circuit disposed on a flexible film. If the two conductors of each pair were completely parallel to the magnetic fields everywhere, there would be no magnetic flux intersecting any closed circuit. Hence, no magnetic induction noise would be induced. However, in practice, in some locations, for example, where the printed circuit for electric connection to the external circuit quits the rotating magnetic field generating coils or where the printed circuit is connected to the magnetic bubble element, there exists more or less magnetic flux intersecting the two conductors. This flux induces magnetic induction noise. Since signal voltages coming from the magnetic bubble element are about 1mV or less, while the sum of the magnetic induction noise at 100 kHz is, in general, several millivolts, the signal and noise levels are in the same order of magnitude.

The noise level induced at the connection of a pair of conductors in a printed circuit to a magnetic bubble element, where the latter is disposed on a flexible film, and the pair of conductors in the printed circuit are so connected to the magnetic bubble element by two bonding leads that the bonding leads are as short as possible, can be calculated as follows. The rotating magnetic field is parallel to the pair of conductors and perpendicular to the side surfaces of the magnetic bubble element. Therefore, magnetic induction noise is induced in the closed circuit including the two bonding leads. Its value can be determined by using the following formula:

$$V = \mu_o S H \omega,$$

where $\mu_o$ is the permeability of air, S is the area of a closed loop in a projection plane intersecting the rotating magnetic field, and H and $\omega$ are the intensity and an angular frequency of the rotating magnetic field, respectively. For a distance of 0.5 mm between the bonding leads, a magnetic bubble element height of 0.5 mm, a frequency and an amplitude of the rotating magnetic field of 100 kHz and 40 Oe, the noise level is 0.63 mV. Under the same conditions, measured values were between 0.5 and 1mV. Thus, the noise level induced at the connection of a pair of conductors to a magnetic bubble element disposed on a flexible film is not at all negligible with respect to signals.

SUMMARY OF THE INVENTION

One object of the invention is, therefore, to provide a circuit arrangement for suppressing magnetic induction noise due to an alternating magnetic field, which is applicable to printed circuit.

Another object of the invention is to provide a circuit arrangement, in which magnetic induction noise is extremely small even at a connection of a pair of conductors in a printed circuit to a magnetic bubble element.

In order to achieve the first object, in a circuit arrangement according to this invention, a third conductor is added to a pair of first and second parallel conductors transmitting signals, a part of which is located in an alternating magnetic field. The three conductors are so arranged that the first and third conductors are symmetrical with respect to the center line of the second conductor and the first and third conductors are interconnected at both extremities thereof.

The second object of this invention is achieved by constructing a magnetic bubble memory device so that the upper surface of the three signal transmitting conductors is coplanar with the upper surface of a corresponding magnetic bubble element.

Other objects and advantages of this invention will be described in greater detail in some preferred embodiments in conjunction with the drawing, but it should be understood that various modifications and variations are possible without departing from the scope of this invention.

DETAILED DESCRIPTION

EMBODIMENT 1

Figure 1:
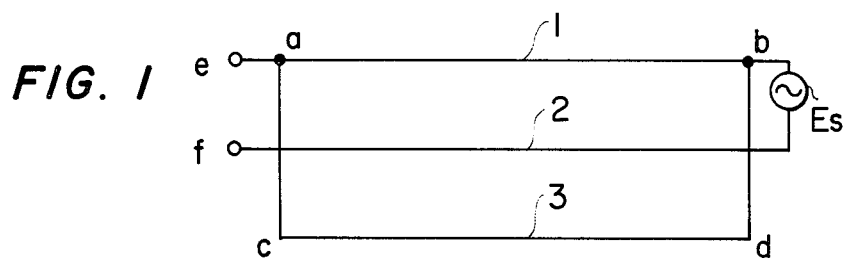
FIG. 1 is an explanatory diagram schematically showing the present invention.

A circuit arrangement for suppressing magnetic induction noise according to the invention is schematically shown in FIG. 1, in which a pair of parallel conductors 1 and 2 are connected to a signal source $E_s$ at one end, and signals are detected at the other ends e and f. Another conductor 3 is coplanar with and parallel with the pair of conductors 1 and 2. The distance between the conductors 1 and 2 is equal to the distance between the conductors 2 and 3. Therefore, the first and third conductors 1 and 3 are symmetrical with respect to the center line of the conductor 2. The two extremities c and d of the conductor 3 and a and b of conductor 1 are respectively interconnected.

The resistance of the conductor 1 between a and b is not necessarily equal to the resistance of the two leads and the cnductor 3 a-c-d-b. In order to reduce the magnetic induction noise as much as possible, it is preferably that they be equal.

The principle of the circuit arrangement for suppressing magnetic induction noise according to the invention is as follows. The three conductors indicated in FIG. 1, which are placed in a uniform alternating magnetic field, form three closed loops, i.e. closed loop A consisting of the conductor 1, the signal source $E_s$ the conductor 2 and the input resistance of the signal receiver (not shown), closed loop B consisting of the conductor 2, the signal source $E_s$, the conductor 3 and the input resistance of the signal receiver, and closed loop C consisting of the stretch a-b of the conductor 1, the two leads a-c and d-b, and the conductor 3. Among these three closed loops, the alternating voltage induced by the intersection of the alternating magnetic field and the closed loop C has no influence at detection terminals e and f.

Figure 2:
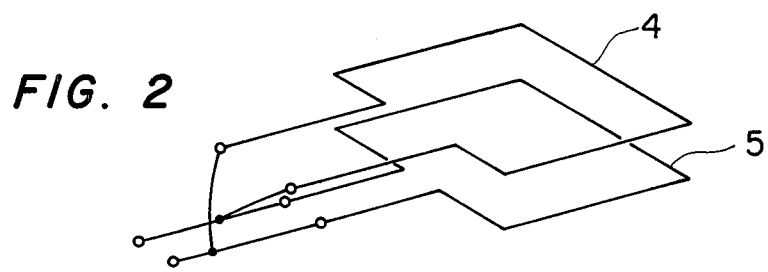
FIGS. 2 and 3 are other explanatory diagrams schematically showing the present invention.

Since the area of the closed loop A and that of the closed loop B intersecting the alternating magnetic field are equal, and they intersect the latter in opposite directions, magnetic induction noise induced in these two closed loops compensate each other. This situation is similar to the case where no magnetic induction noise appears at the detection terminal, when two coils of one turn 4 and 5 having a same shape are connected reversely in parallel (i.e. in such a manner that the direction of electro motive force induced by the intersection of an alternating magnetic field is opposite for the two coils), as indicated in FIG. 2. Thus, by adding a third conductor 3 to a pair of first and second parallel conductors 1 and 2, magnetic induction noise can be reduced to an extremely low level and signal-to-noise ratio is reduced considerably.

Figure 3:
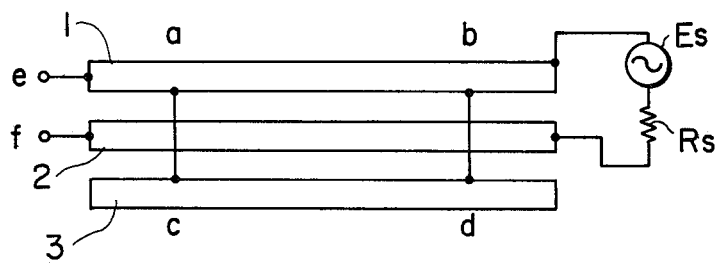

The merit of this invention will be understood by calculating the electromotive force in the circuit arrangement indicated in FIG. 3, in which the three conductors 1, 2 and 3 are all 0.5 mm wide, the distances between adjacent conductors 1, 2 and 2, 3 are 1 mm from center to center of the conductors, and the amplitude of the alternating magnetic field having a frequency of 100 kHz intersecting the conductors in a stretch of 10 cm is 10 Oe. In this case, the amplitude of the magnetic induction noise V induced in a closed loop consisting of the conductors 1 and 2 is 62.8 mV. This value is calculated by using the formula previously given. The amplitude of the magnetic induction noise induced in a closed loop consisting of the conductors 2 and 3 is also 62.8 mV. If the resistance of the stretch a-b is equal to that of the stretch a-c-d-b, the alternating magnetic field has no influence at the detection terminal e-f. If they are not equal, the alternating magnetic field can induce an alternating voltage at the detection terminal e-f. For example, for an electromotive force of 62.8 mV induced in the closed loops A and B, a resistance of 0.1 Ω of the stretch a-b, a resistance of 0.15 Ω of the stretch a-c-d-b, a resistance of 0.1 Ω of the stretch between a-c and b-d of the conductor 2, an internal resistance $R_s$ of 10 Ω of the signal source $E_s$, and an input resistance of 10 Ω of the signal receiver, the noise level produced in the input resistance by the closed loop A is 31.9 mV, while that produced by the closed loop B is 31.36 mV. The difference between these two values, i.e. 0.27 mV constitutes part of the noise. For output voltages of the signal source $E_s$ smaller than several millivolts, this noise level is not negligible and adversely affects the signal-to-noise ratio. Consequently, for small signal voltages, the resistance of the stretch a-b should be as close as possible to that of the stretch a-c-d-b.

Circuit arrangements according to this invention can be easily fabricated in the form of printed circuits. In this manner, it is easy to dispose the conductors so that the outer conductors are symmetric with respect to the center line of the central conductor.

EMBODIMENT 2

Figure 4A:
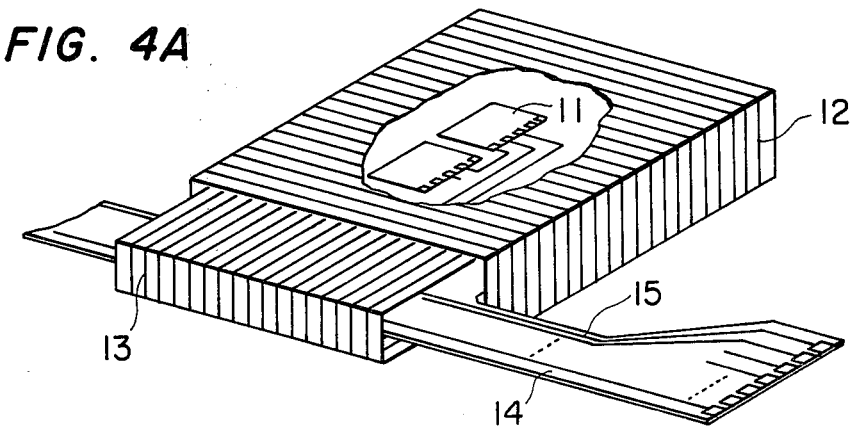
FIG. 4A is a perspective view of a magnetic bubble module, a part of rotating magnetic field generating coils of which is removed in order to show the magnetic bubble elements disposed in them.

FIG. 4A is a perspective view of a magnetic bubble memory module, in which reference numeral 11 is a magnetic bubble element, 12 is a coil I generating an alternating magnetic field, and 13 is a coil II generating another alternating magnetic field. These two alternating magnetic fields form a rotating magnetic field which is parallel to the magnetic bubble element 11. The electric connection of the magnetic bubble element 11 to an external circuit is secured by a printed circuit 15 disposed on a flexible film 14.

Figure 4B:
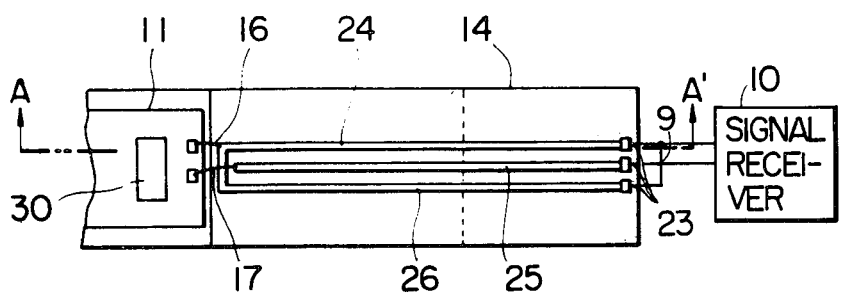
FIGS. 4B and 4C are a plane view and a cross-sectional view of a part of a magnetic bubble element and conductors, respectively.
Figure 4C:
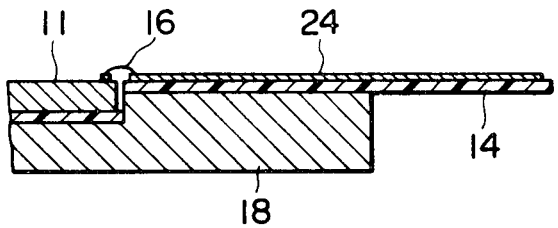

FIG. 4B is a plane view representing a part of the magnetic bubble element 11, two bonding leads 16 and 17 connecting the magnetic bubble element 11 to the printed circuit 15, and a part of the latter, and FIG. 4C is a cross-sectional view along the line A-A' in FIG. 4B. In the figures reference numerals 24, 25 and 26 are conductors according to the invention, constituting a part of the printed circuit 15, 23 are pads for connecting the conductors 24, 25 and 26 to an external circuit, and 30 is a bubble detector. The conductors 24, 25 and 26 are formed on the flexible film 14 by well-known photoetching techniques, so that they are parallel to each other and equally distant from each other. All the conductors 24, 25 and 26 are 40–60 mm long and 0.25 mm wide. The intervals between the central conductor 25 and the two side conductors 24 and 26 are also 0.25 mm. The two side conductors 24 and 26 are interconnected at the end near the magnetic bubble element 11 and by a bonding lead 9 at their other ends. The conductors 24 and 26 are connected to a signal receiver 10 through the pads 23.

The flexible film 14 is affixed to a ceramic substrate 18 which is thick at the location of the printed circuit 15 and thin at the location of the magnetic bubble element 11 so that the upper surface of the conductors 24, 25 and 26 and that of the magnetic bubble element 11 are substantially coplanar. Therefore, the bonding leads 16 and 17 do not intersect the rotating magnetic field, which is parallel to the magnetic bubble element 15, thus no magnetic induction noise takes place at the bonding leads 16 and 17.

Figure 5:
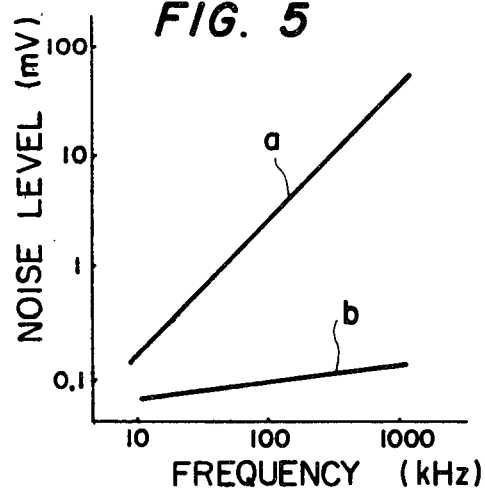
FIG. 5 is a diagram showing the relationship between the noise level and frequency of the rotating magnetic field.

FIG. 5 shows an example of the relationship between the magnetic induction noise level and the frequency of the rotating magnetic field at an amplitude of the latter of 40 Oe, in which b represents values measured under the conditions mentioned above according to the invention and a represents values measured under the same conditions except that the conductor 26 is disconnected. As shown in the figure, it is clear that the signal-to-noise ratio for the output voltage of the bubble detector can be reduced considerably owing to merits of this invention.

EMBODIMENT 3

Figure 6A:
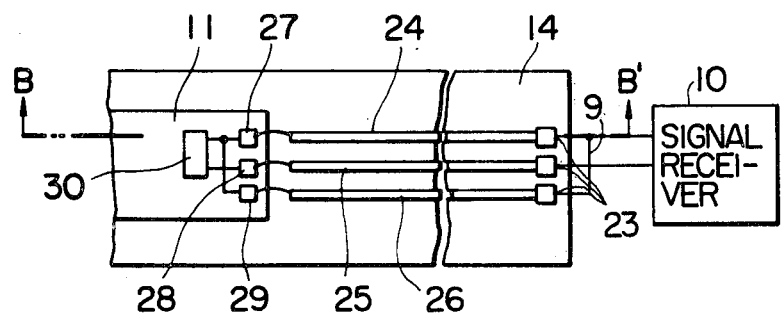
FIGS. 6A and 6B are a plane view and a cross-sectional view of a part of another magnetic bubble element and conductors, respectively.
Figure 6B:
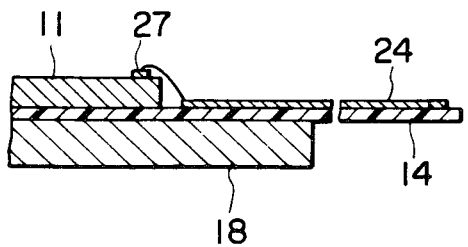

FIG. 6A is a plane view of another circuit arrangement according to this invention, and FIG. 6B is a sectional view along the line B-B' in FIG. 6A. The conductors 24, 25 and 26 are connected by three bonding leads to pads 27, 28 and 29 disposed on the magnetic bubble element 11, respectively, and two side pads 27 and 29 are interconnected in the magnetic bubble element 11. In this embodiment, the flexible film 14 can be affixed to a ceramic substrate 18 which is uniformly thick. The upper surface of the conductors 24, 25 and 26 is different from that of the pads 27, 28 and 29, but magnetic induction noises induced at the bonding leads compensate for each other owing to the circuit arrangement having three conductors according to the invention.

EMBODIMENT 4

Output signals from the magnetic bubble element can be amplified by a semiconductor device disposed in the rotating magnetic field without influence of the latter.

Figure 7A:
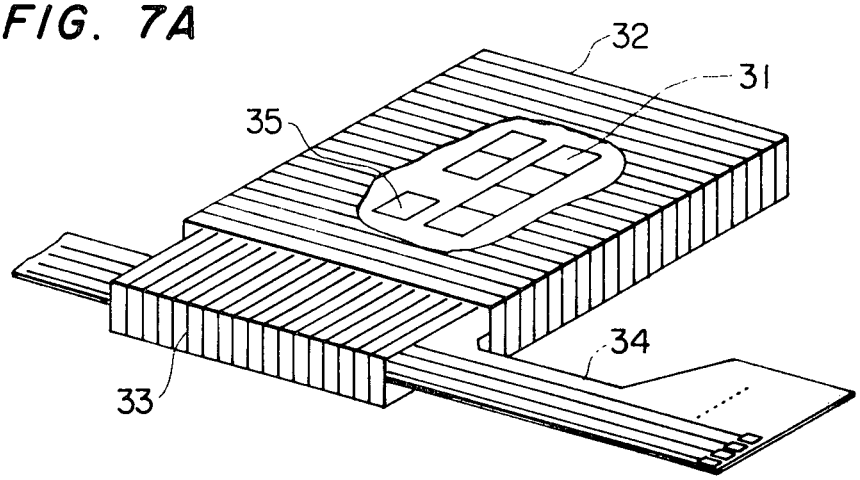
FIG. 7A is a perspective view of a magnetic bubble memory module.
Figure 7B:
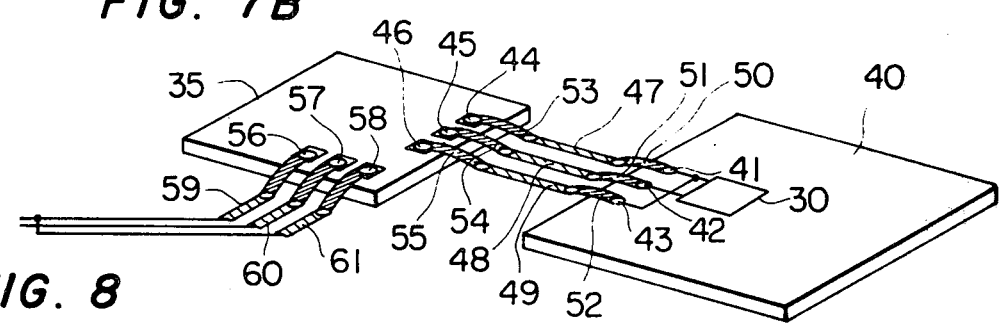
FIG. 7B is a perspective view of a magnetic bubble element and semiconductor amplifying device incorporated in the magnetic bubble memory module shown in FIG. 7A.

Output signals from a bubble detector in a magnetic bubble element 31 are amplified and treated by a semiconductor device 35 disposed on a substrate 34 located in two rotating magnetic field generating coils 32, 33, as indicated in FIG. 7A. A magnetic bubble element 40 having three bonding pads 41, 42 and 43 at its bubble detector, as described in Embodiment 2, is connected through six bonding leads 50, 51, 52, 53, 54 and 55 and three parallel conductors 47, 48 and 49 to the semiconductor device 35 which has three bonding pads 44, 45 and 46 at its input terminal, as indicated in FIG. 7B. The pads 41, 42, 43 are connected as indicated either in FIG. 4B or in FIG. 6A. Output signals from the semiconductor device are sent through three bonding pads 56, 57 and 58 and three parallel conductors 59, 60 and 61 to an external circuit outside of the coils. In this way, no magnetic induction noise due to the rotating magnetic field is induced at any place in the entire circuit arrangement. In a magnetic bubble memory module fabricated in this way, the noise level produced by a rotating magnetic field of 40 Oe at a frequency of 1 MHz was several tens of $\mu V$, thus negligibly small.

EMBODIMENT 5

Figure 8:
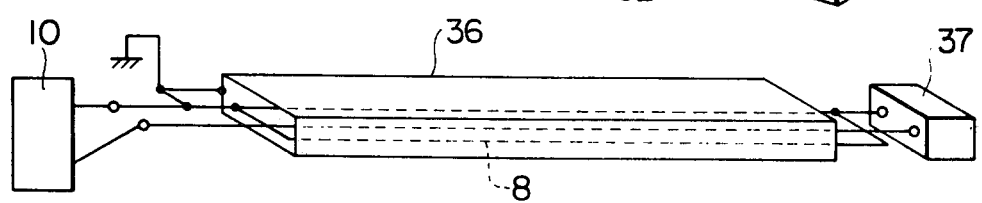
FIG. 8 is a schematic view of another example of the circuit arrangement of this invention.

This invention can be applied to any circuit for measuring extremely small signals disposed in an alternating magnetic field other than the magnetic bubble memory device. In case noise due to an alternating magnetic field induced by commercial power source, etc. cannot be suppressed satisfactorily by using a static shield, the magnetic induction noise is reduced by the shield indicated in FIG. 8 according to the invention. In the figure, reference numeral 36 is a static shield made of e.g. copper, 37 is a source of extremely small signals, 10 is an electronic circuit such as an amplifier, and 8 is a circuit arrangement having three parallel conductors according to the invention.

EMBODIMENT 6

Figure 9:
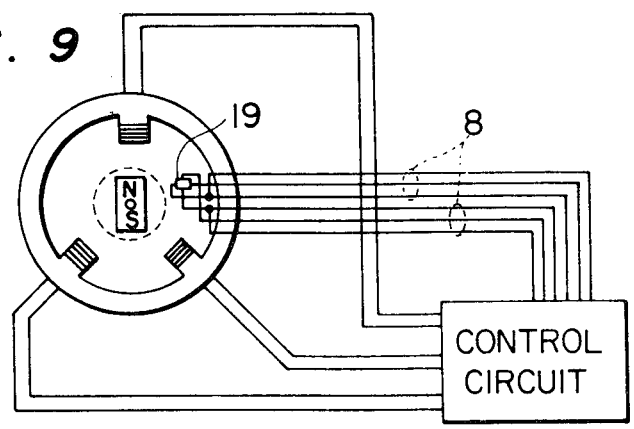
FIG. 9 is a schematic circuit diagram of a brushless motor according to the present invention.

FIG. 9 shows an example in which the invention is applied to noise suppression for signals from a Hall element disposed in a brushless motor. A Hall element 19 used for control of a motor is located in proximity of the rotor. Electric current in the field coils of the motor is varied by a switching circuit, producing an alternating magnetic field around the motor. Four leads are connected to a Hall element 19; two for input direct current and two for output signals. By replacing these two pairs of leads by two pairs of circuit arrangements 8 each consisting of three parallel conductors according to the invention, as indicated in FIG. 9, the influence of the alternating magnetic field on the signals coming from the Hall element is considerably reduced and variations in the magnetic field due to rotation of the rotor can be transmitted to a control circuit with high fidelity.

It should be understood that the invention can be successfully applied to any electric circuit handling extremely small signals disposed in an alternating magnetic field. Applying it to an integrated circuit, magnetic induction noise produced in one circuit by electric current passing through another can be reduced. Integrated circuits equipped with the circuit arrangments of the invention can be utilized in an alternating magnetic field, e.g. near an electric motor, a generator, or an alternating current supply.

We claim:

1. A circuit arrangement for suppressing magnetic induction noise due to an alternating magnetic field comprising:

first and second parallel conductors transmitting signals from a signal source to a signal receiver; and a third conductor which is coplanar with and parallel to said first and second conductors and which is interconnected to said first conductor at both extremities thereof, the three conductors being so disposed that said first and third conductors are symmetric with respect to the center line of the second conductor.

2. A circuit arrangement according to claim 1, wherein said first and second conductors are connected to two output pads disposed on an upper surface of a magnetic bubble layer which is coplanar with said three conductors.

3. A circuit arrangement according to claim 1, wherein the resistance of a closed looped circuit comprising said first and second conductors is equal to that of a closed looped circuit comprising said second and third conductors.

4. A circuit arrangement according to claim 1, further comprising a static shield, inside of which said three conductors are disposed.

5. A circuit arrangement according to claim 1, wherein said first, second and third conductors extend in parallel to one another while lying in the same plane.

6. A circuit arrangement according to claim 5, wherein said first, second and third conductors are films having the major surface area thereof lying in the same plane.

7. A circuit arrangement for suppressing magnetic induction noise caused by an alternating magnetic field comprising:
  a signal source having first, second and third output pads, said second output pad being disposed between and spaced an equal distance apart from said first and third output pads, said signal source being connected to said first and second output pads;
  first, second and third conductors disposed in parallel with each other, said second conductor being disposed between said first and third conductors, and said first and third conductors being symmetrically disposed relative to said second conductor and coplanar therewith;
  first, second and third parallel bonding leads respectively interconnecting said first, second and third output pads to one end of each of said first, second and third conductors;
  a fourth bonding lead interconnecting said first and third output pads; and
  a fifth bonding lead interconnecting the other ends of said first and third conductors.

8. A circuit arrangement for suppressing magnetic induction noise caused by an alternating magnetic field comprising:
  a signal source having first, second and third output pads, said second output pad being disposed between and spaced an equal distance apart from said first and third output pads, said signal source being interconnected to said first and second output pads, said first and third output pads being interconnected to each other;
  first, second and third conductors disposed in parallel with each other, said second conductor being disposed between said first and third conductors, and said first and third conductors being symmetrically disposed relative to said second conductor and coplanar therewith;
  first, second and third parallel bonding leads respectively interconnecting said first, second and third output pads to one end of each of said first, second and third conductors;
  a semiconductor amplifying device having first, second and third input pads, said second input pad being disposed between and spaced an equal distance apart from said first and third input pads, and fourth, fifth and sixth output pads, said fifth output pad being disposed between and spaced an equal distance apart from said fourth and sixth output pads;
  fourth, fifth and sixth conductors disposed in parallel with each other, said fifth conductor being disposed between said fourth and sixth conductors, and said fourth and sixth conductors being symmetrically disposed relative to said fifth conductor;
  seventh, eighth and ninth parallel bonding leads, respectively interconnecting said fourth, fifth and sixth output leads to one end of each of said fourth, fifth and sixth conductors; and
  a tenth bonding lead interconnecting the other ends of said fourth and sixth conductors.

9. In a Hall element control circuit having a Hall element for supplying a detection control signal for control of an alternating magnetic field wherein respective first and second pairs of signal leads are connected to said Hall element, the improvement comprising first and second circuit arrangements for suppressing induction noise due to said alternating magnetic field, each of said circuit arrangements comprising:
  first and second parallel conductors connected to a respective pair of signal leads; and
  a third conductor which is coplanar with and parallel to said first and second conductors and which is interconnected to said first conductor at the opposite ends thereof, the first, second and third conductors being so disposed that said first and third conductors are symmetrically disposed relative to said second conductor.

* * * * *